United States Patent
Kozuka et al.

(10) Patent No.: US 9,136,033 B2
(45) Date of Patent: Sep. 15, 2015

(54) SINTERED OXIDE COMPACT AND CIRCUIT BOARD USING SAME

(71) Applicant: NGK SPARK PLUG CO., LTD., Nagoya-shi, Aichi (JP)

(72) Inventors: Hisashi Kozuka, Ichinomiya (JP); Tomoko Hishida, Nagoya (JP); Hideto Yamada, Komaki (JP); Kazushige Ohbayashi, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 14/390,786

(22) PCT Filed: Apr. 2, 2013

(86) PCT No.: PCT/JP2013/002283
§ 371 (c)(1),
(2) Date: Oct. 5, 2014

(87) PCT Pub. No.: WO2013/150779
PCT Pub. Date: Oct. 10, 2013

(65) Prior Publication Data
US 2015/0099142 A1 Apr. 9, 2015

(30) Foreign Application Priority Data
Apr. 6, 2012 (JP) ................. 2012-087078

(51) Int. Cl.
*H01B 1/08* (2006.01)
*H05K 1/03* (2006.01)
*H05K 1/09* (2006.01)
*C04B 35/50* (2006.01)
*C04B 35/01* (2006.01)

(52) U.S. Cl.
CPC ........ *H01B 1/08* (2013.01); *C04B 35/01* (2013.01); *C04B 35/50* (2013.01); *H05K 1/0306* (2013.01); *H05K 1/09* (2013.01); *C04B 2235/3224* (2013.01); *C04B 2235/3227* (2013.01); *C04B 2235/3229* (2013.01);
(Continued)

(58) Field of Classification Search
None
See application file for complete search history.

(56) References Cited

U.S. PATENT DOCUMENTS 6,054,403 A * 4/2000 Kawase et al. ............... 501/152
6,136,741 A * 10/2000 Nakayama et al. ........... 501/152
(Continued)

FOREIGN PATENT DOCUMENTS

EP 1408018 A1 * 4/2004 ............. C04B 35/01
JP 06-329463 A 11/1994
(Continued)

OTHER PUBLICATIONS

JPO/ISA, International Search Report issued in corresponding international application No. PCT/JP2013/002283, mailed May 7, 2013.

*Primary Examiner* — David Sample
(74) *Attorney, Agent, or Firm* — Stites & Harbison, PLLC; Jeffrey A. Haeberlin

(57) ABSTRACT

Provided is a sintered oxide compact that has high electric conductivity and a small B-value (temperature coefficient), and is suitable for use as an electrically conductive material, and a circuit board that uses the sintered oxide compact. The sintered oxide compact is represented by a composition formula: $RE_aCo_bNi_cO_x$ (where RE represents a rare earth element, $a+b+c=1$, and $1.3 \leq x \leq 1.7$), the sintered oxide compact includes a perovskite phase with a perovskite-type oxide crystal structure, and the a, b, and c satisfy the following relationships:

$0.459 \leq a \leq 0.535$, $0.200 \leq b \leq 0.475$, and $0.025 \leq c \leq 0.300$.

8 Claims, 3 Drawing Sheets

(52) U.S. Cl.
CPC .................. *C04B 2235/3275* (2013.01); *C04B 2235/3279* (2013.01); *C04B 2235/768* (2013.01); *C04B 2235/80* (2013.01); *H05K 2201/0326* (2013.01)

(56) References Cited

U.S. PATENT DOCUMENTS 6,222,262 B1 * 4/2001 Ueno et al. .................... 257/703
6,358,875 B1 * 3/2002 Kawase et al. ................ 501/152

FOREIGN PATENT DOCUMENTS

| JP | 10-275724 A | 10/1998 |
|---|---|---|
| JP | 11-116334 A | 4/1999 |
| JP | 2002-87882 A | 3/2002 |
| JP | 3286906 B2 | 3/2002 |
| JP | 2012-056809 A | 3/2012 |
| JP | 2012-56810 A | 3/2012 |

* cited by examiner

SINTERED OXIDE COMPACT AND CIRCUIT BOARD USING SAME

TECHNICAL FIELD

The present invention relates to a sintered oxide compact that include a perovskite phase, and to a circuit board using the same.

BACKGROUND ART

Many ceramic products are configured from a ceramic portion, which is a functional and structural member, and an electrode portion made of metal. Examples of combinations of such ceramic products and electrode portions include stacked ceramic capacitors (Ni, Pd, Pt electrodes), LTCC components (Ag, Cu, Ag—Pd electrodes), piezo actuators (Pd electrode), semiconductor packages (W electrode), and spark plugs (Ir, Pt electrodes).

However, firing of Ni, Cu, and W with the ceramic portion requires atmosphere control, which makes it difficult to obtain the intended performance of the ceramic portion. Another problem is the high manufacturing cost. On the other hand, since the melting point of Ag is low (962° C.), the type of applicable ceramics becomes limited, and further, the low-temperature firing may impair the ceramic properties. Further, noble metal materials such as Pd, Ir, and Pt are expensive, and thus, are not easily applicable to electrodes that require large areas.

Meanwhile, as an example of an oxide for use in ceramic portions, there is known a lanthanum cobalt oxide having a negative resistance temperature property which shows high resistance values at an ordinary temperature and in which the resistance value decreases with increasing temperatures (Patent Literatures 1 and 2). Further, the electrically conductive oxide of the Patent Literature 2 has a high resistance value near room temperature, and moreover, has a B-value with a small gradient near room temperature, and has the B-value with a large gradient at high temperatures.

CITATION LIST

Patent Literature

Patent Literature 1: JP-B2-3286906
Patent Literature 2: JP-A-2002-87882

SUMMARY OF INVENTION

Technical Problem

Meanwhile, since the above-described various problems occur when forming the electrode portion of ceramic products by metal, the present inventors thought of using oxides (ceramics) for the electrode portion. However, it has been difficult to replace metals with oxides because conventional oxides have lower electric conductivity and larger B-values (temperature coefficients) than metals. Here, although ruthenium oxides (e.g., $RuO_2$, and $SrRuO_3$) are known to have high electric conductivity, there is a problem that Ru is expensive.

Accordingly, an object of the present invention to provide a sintered oxide compact that has high electric conductivity and a small B-value (temperature coefficient) and is suitable for use as an electrically conductive material, and a circuit board that uses the sintered oxide compact.

Solution to Problem

In order to solve the above-described problem, a sintered oxide compact of the present invention is characterized in that:

the sintered oxide compact is represented by a composition formula: $RE_aCo_bNi_cO_x$ (where RE represents a rare earth element, $a+b+c=1$, and $1.3 \leq x \leq 1.7$);

the sintered oxide compact comprises a perovskite phase with a perovskite-type oxide crystal structure; and the a, b, and c satisfy the following relationships:

$0.459 \leq a \leq 0.535$, $0.200 \leq b \leq 0.475$, and $0.025 \leq c \leq 0.300$.

With such a sintered oxide compact, the electric conductivity and the B-value (temperature coefficient of electric conductivity) can be controlled by varying the proportions of the trivalent Co and the bivalent Ni. Further, the electric conductivity can be controlled to be high and the B-value (temperature coefficient) can be controlled to be low by setting a, b, and c in the above-described ranges. With the above-described composition formula, an electric conductivity of the sintered oxide compact at 25° C. becomes 3.0 S/cm or more as measured by using a DC four-terminal method, and a B-value (temperature coefficient of electric conductivity) at 25° C. to 870° C. becomes 2500 K or less, whereby the sintered oxide compact can have properties suitable as an electrically conductive material. Further, by setting a, b, and c in the above-described ranges, the coefficient of thermal expansion under varying temperatures of from room temperature to 1000° C. can be reduced to $2.0 \times 10^{-5} K^{-1}$ or less, and there is an advantage that the coefficient of thermal expansion of the sintered oxide compact can easily be matched to that of the material of a base or a substrate, when forming the sintered oxide compact as an electrically conductive material on the base or the substrate. Further, it is possible to obtain a sintered oxide compact which is suitable for use in high-temperature environment.

It is preferable that the RE is La.

With this configuration, it is possible to obtain a sintered oxide compact having effectively high electric conductivity and a small B-value.

It is preferable that the a, b, and c satisfy the following relationships:

$0.474 \leq a \leq 0.524$, $0.200 \leq b \leq 0.475$, and $0.025 \leq c \leq 0.300$.

With this configuration, it is possible to obtain a sintered oxide compact having a denser structure.

It is preferable that the RE is La, and the b and c satisfy the following relationships:

$0.200 \leq b \leq 0.375$, and $0.125 \leq c \leq 0.300$.

According to such a sintered oxide compact, the electric conductivity at 25° C. becomes 250 S/cm or higher and the B-value becomes 600 K or less, that is, the electric conductivity becomes even higher and the B-value becomes even smaller. Further, in such a sintered oxide compact, the coefficient of thermal expansion can be made even smaller to $1.6 \times 10^{-5} K^{-1}$ or less.

It is preferable that the sintered oxide compact further comprises $RE_4Co_3O_{10}$ or $RE_4Ni_3O_{10}$ in addition to the perovskite phase.

According to such a sintered oxide compact, the electric conductivity at 25° C. becomes 250 S/cm or higher and the B-value becomes 600 K or less, that is, the electric conductivity becomes even higher and the B-value becomes even smaller.

It is preferable that the sintered oxide compact further contains substantially no alkali earth metal element. By containing substantially no alkali earth metal element, the weight of the sintered oxide compact itself does not easily change, that is, oxygen absorption and release do not occur easily, even when the sintered oxide compact is placed in a high-temperature environment (for example, 500° C. or higher), and changes in electric conductivity and B-value do not easily occur. Accordingly, it is possible to obtain a sintered oxide compact which is suitable for being used as an electrically conductive material in a high-temperature environment.

A circuit board of the present invention is a circuit board in which the sintered oxide compact is formed as an electrically conductive layer on a surface of a ceramic substrate. In this way, it possible to provide a circuit board that has an electrically conductive layer of a desirable electric conductivity formed on a ceramic substrate surface, without using a noble metal material.

Advantageous Effects of Invention

According to the invention, a sintered oxide compact that has high electric conductivity and a small B-value (temperature coefficient) and is suitable for use as an electrically conductive material (electric conductor), and a circuit board that uses the sintered oxide compact can be provided.

DESCRIPTION OF EMBODIMENTS

Figure 1:
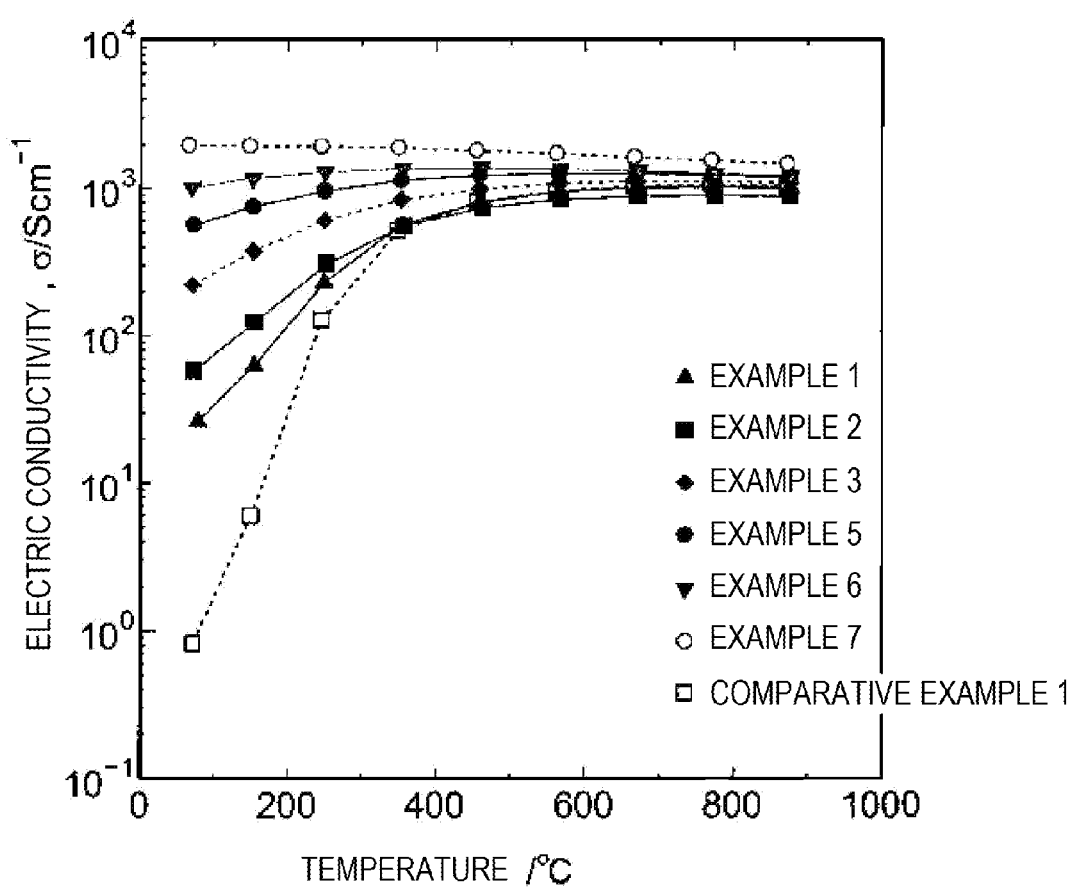
FIG. 1 is a diagram showing a relationship between electric conductivity and temperature for each Examples and Comparative Example 1.

Embodiments of the present invention will be described hereinafter.

A sintered oxide compact according to an embodiment of the present invention is represented by the composition formula: $RE_aCo_bNi_cO_x$ (where RE represents a rare earth element, $a+b+c=1$, and $1.3 \leq x \leq 1.7$), and includes a perovskite phase with a perovskite-type oxide crystal structure, where a, b, and c satisfy the following relationships $0.459 \leq a \leq 0.535$, $0.200 \leq b \leq 0.475$, and $0.025 \leq c \leq 0.300$.

When a is less than 0.459 (that is, the proportion of RE is too small) or when a exceeds 0.535 (that is, the proportion of RE is too large), the sintered oxide compact has poor sinterability.

When c is less than 0.025 (that is, the proportion of Ni is too small), the electric conductivity at 25° C. becomes less than 3.0 S/cm, and the B-value exceeds 2500 K, making the sintered oxide compact unsuitable as an electrically conductive material. On the other hand, when c exceeds 0.300 (that is, the proportion of Ni is too large), the sintered oxide compact has poor sinterability.

When b is less than 0.200 (that is, the proportion of Co is too small) or when b exceeds 0.475 (that is, the proportion of Co is too large), the proportions of the other elements fall outside of the above-described ranges, and the sintered oxide compact is not suitable as an electrically conductive material or has poor sinterability.

It should be noted here that x is theoretically 1.5 when the sintered oxide compact according to the embodiment of the present invention is solely of a perovskite phase. Notwithstanding above, the range $1.3 \leq x \leq 1.7$ is specified because the oxygen may deviate from the stoichiometric composition.

It is only necessary that the RE (rare earth element) is at least one selected from Group III elements of the periodic table. Preferably, it is suitable to use at least one selected from La, Pr, Ce, and Gd so as to control the electric conductivity and the B-value. Particularly, La is preferred for its ability to control the electric conductivity to be effectively high and control the B-value to be small.

In the sintered oxide compact according to the embodiment of the present invention, it is only necessary that the sintered oxide compact includes the perovskite phase, and the content of the perovskite phase in the sintered oxide compact according to the embodiment of the present invention is not particularly limited. Here, the sintered oxide compact is regarded as including a perovskite phase when a peak of the ternary oxide in $RE.MO_3$ (M is Co or Ni) is detected in a powder X-ray diffraction (XRD) measurement of the sintered oxide compact (see FIGS. 2 to 4). It is preferable that the sintered oxide compact includes the perovskite phase in 50 mass % or more.

Further, it is preferable for a, b, and c to satisfy the relationships $0.474 \leq a \leq 0.524$, $0.200 \leq b \leq 0.475$, and $0.025 \leq c \leq 0.300$ because it makes the structure of the sintered oxide compact denser.

Particularly, it is preferable that La is used as the RE (rare earth element), and b and c satisfy the relationships $0.200 \leq b \leq 0.375$ and $0.125 \leq c \leq 0.300$, because the electric conductivity at 25° C. becomes 250 S/cm or higher and the B-value becomes 600 K or less, that is, the electric conductivity becomes even higher and the B-value becomes even smaller. Further, the sintered oxide compact tends to contain $RE_4Co_3O_{10}$ or $RE_4Ni_3O_{10}$ in addition to the perovskite phase, when the molar ratios of b and c fall within the above-described ranges. Note that the sintered oxide compact is regarded as containing $RE_4Co_3O_{10}$ or $RE_4Ni_3O_{10}$ when peaks of $RE_4Co_3O_{10}$ or $RE_4Ni_3O_{10}$ are detected in a powder X-ray diffraction (XRD) measurement of the sintered oxide compact (see FIGS. 2 to 4).

It is preferable that the sintered oxide compact according to the embodiment of the present invention contains substantially no alkali earth metal element, though this does not exclude containing very small amounts of alkali earth metal elements to an extent that the electric conductivity is not adversely affected. The weight of the sintered oxide compact does not easily change, that is, oxygen absorption and release do not occur easily, even when the sintered oxide compact is exposed to temperatures ranging from room temperature to about 900° C. Accordingly, it is possible to obtain a sintered oxide compact which can be suitably used as an electrically conductive material in a high-temperature environment. It should be noted that, in the present invention, "containing substantially no alkali earth metal element" means that an alkali earth metal element is not detectable or identifiable by the X-ray fluorescence analysis (XRF).

The sintered oxide compact according to the embodiment of the present invention can be produced by firing a mixed slurry of a raw material powder and an organic binder or the like at, for example, 1250 to 1450° C. for 1 to 5 hours under the air atmosphere or the oxygen atmosphere. If the firing temperature is below 1250° C., it may not be possible to densify the material, and thus, it may not be possible to obtain the desired electric conductivity and B-value. If the firing temperature is above 1450° C., oversintering occurs and densification is deteriorated, and thus, it may not be possible to obtain the desired electric conductivity and B-value.

The sintered oxide compact according to the embodiment of the present invention may be used as substitutes for metal in, for example, various electrode materials, electric wire materials, thermoelectric materials, heater materials, and temperature detecting elements. The sintered oxide compact according to the embodiment of the present invention also may be used for, for example, resistor elements.

A circuit board according to an embodiment of the present invention includes the electrically conductive sintered oxide compact formed as an electrically conductive layer on a surface of a ceramic substrate. As the ceramic substrate, ceramic materials such as alumina, zirconia, and silicon nitride can be used.

It is to be understood that the present invention is not limited by the above-described embodiments, and the invention encompasses various modifications and equivalents within the spirit and scope of the present invention.

EXAMPLES $REOH_3$ or $RE_2O_3$, $Co_3O_4$ and NiO (RE represents the rare earth elements shown in Table 1, and all of them are commercially available products with 99% or higher purity) were used as raw material powders. These raw material powders were weighed so as to become the compositions $RE_aCo_bNi_cO_x$ shown in Table 1, and wet mixed and dried to prepare raw material powder mixtures. No alkali earth metal element was added in the preparation of the raw material powder mixtures. The raw material powder mixtures were each fired at 1000 to 1200° C. for 1 to 5 hours to obtain a preform powder. Then, an appropriate amount of organic binder was added to the preform powder, the mixture was put into a resin pot together with ethanol serving as a dispersion medium, and was subjected to wet mixed grinding using zirconia balls to obtain a slurry. The slurry was dried at 80° C. for about 2 hours, and granulated through a 250 μm-mesh sieve to obtain a granulated powder.

The granulated powder was molded into a prism-shaped molded article measuring 4.0 mm×4.0 mm×20 mm height by using a pressing machine (molding pressure: 98 MPa), and was fired under the air atmosphere at a temperature of 1250 to 1450° C. for 1 to 5 hours. The resulting sintered material was surface ground to obtain a sintered oxide compact measuring 3.0 mm×3.0 mm×15 mm height.

The electric conductivity of each sintered oxide compact was measured by using a DC four-terminal method. Pt was used for the measurement electrodes and electrode wires. A voltage-current generator (Monitor 6242; manufactured by ADC Corporation) was used for the electric conductivity measurement.

From the measured electric conductivity values at 25° C. and 870° C., the B-value (K) was calculated by using the following equation (1).

$$B\text{-value}=\ln(\rho 1/\rho 2)/(1/T1-1/T2) \quad (1)$$

$\rho 1=1/\sigma 1$ $\rho 2=1/\sigma 2$

ρ1: resistivity (Ωcm) at absolute temperature T1 (K)

ρ2: resistivity (Ωcm) at absolute temperature T2 (K)

σ1: electric conductivity (S/cm) at absolute temperature T1 (K)

σ2: electric conductivity (S/cm) at absolute temperature T2 (K)

T1=298.15 (K)

T2=1143.15 (K)

Further, each of the obtained sintered oxide compact was pulverized into a powder, and subjected to powder X-ray diffraction (XRD) measurement to identify the crystal phase. The measurement conditions are as follows.

Measurement device: RINT-TTR-3 (goniometer radius 285 mm), manufactured by Rigaku Optical system: Bragg-Brentano focused optical system X-ray output: 50 kV-300 mA Other Conditions:

Divergence SLIT: 1/3°

Vertical divergence limit SLIT: 10 mm

Scattering SLIT: 1/3°

Receiving SLIT: 0.3 mm

Scan mode: FT

Count time: 2.0 sec

Step width: 0.0200°

Scan axis: 2θ/θ

Scan range: 20.00° to 120.00°

Rotation: Present

Further, the sinterability of each sintered oxide compact was evaluated according to JIS-R-1634. Specifically, the dry weight W1 and the saturation weight W3 of the sample were first measured, and water absorption was calculated by using these values and the following equation (2).

$$\text{Water absorption}(\%)=(W3-W1)/W1\times 100 \quad (2)$$

Evaluation was made according to the following criteria.

x: water absorption is higher than 0.10 wt %

Δ: water absorption is 0.05 wt % to 0.10 wt %

○: water absorption is lower than 0.05 wt %

When the water absorption evaluation result is Δ or ○, the structure of the sintered oxide compact is dense and the sinterability is good, and such sintered materials do not pose a problem when used as an electric conductor in actual applications.

The coefficient of thermal expansion of each sintered oxide compact was measured under varying temperatures of from room temperature to 1000° C. The measurement conditions are as follows.

Measurement device: TMA8310, manufactured by Rigaku

Standard sample: $SiO_2$,

Measurement atmosphere: air atmosphere

Rate of temperature increase: 10.0° C./min

The obtained results are shown in Table 1 and FIGS. 1 to 4. Here, although not shown in Table 1, as a result of the X-ray fluorescence diffraction (XRF) measurement, which was separately electric conducted for each obtained sintered oxide compact, no alkali earth metal element was detected for all of them.

TABLE 1

| | Composition: $RE_aCo_bNi_cO_x$ | | | | Evaluation | | | | Coefficient of thermal expansion ($K^{-1}$) |
|---|---|---|---|---|---|---|---|---|---|
| | Constituting elements (molar ratio) | | | | Electric conductivity σ (S/cm) | | $B_{25-870}$ constant | | |
| | RE | a | b | c | Crystal phase | 25° C. | 870° C. | (K) | Sinterability | |
| Example 1 | La | 0.500 | 0.475 | 0.025 | $REMO_3$ | 17 | 881 | 1589 | ○ | $2.1 \times 10^{-5}$ |
| Example 2 | La | 0.500 | 0.450 | 0.050 | $REMO_3$ | 45 | 881 | 1201 | ○ | $2.0 \times 10^{-5}$ |
| Example 3 | La | 0.500 | 0.400 | 0.100 | $REMO_3$ | 148 | 1082 | 802 | ○ | $1.9 \times 10^{-5}$ |
| Example 4 | La | 0.500 | 0.375 | 0.125 | $REMO_3, RE_4M_3O_{10}$ | 291 | 1030 | 510 | ○ | $1.8 \times 10^{-5}$ |
| Example 5 | La | 0.500 | 0.350 | 0.150 | $REMO_3, RE_4M_3O_{10}$ | 461 | 1193 | 383 | ○ | $1.8 \times 10^{-5}$ |
| Example 6 | La | 0.500 | 0.300 | 0.200 | $REMO_3, RE_4M_3O_{10}$ | 1037 | 1210 | 62 | ○ | $1.6 \times 10^{-5}$ |
| Example 7 | La | 0.500 | 0.250 | 0.250 | $REMO_3, RE_4M_3O_{10}$ | 1903 | 1465 | −106 | ○ | $1.4 \times 10^{-5}$ |
| Example 8 | La | 0.500 | 0.200 | 0.300 | $REMO_3, RE_4M_3O_{10}$ | 275 | 1051 | 540 | ○ | $1.3 \times 10^{-5}$ |
| Example 9 | La | 0.474 | 0.263 | 0.263 | $REMO_3, RE_4M_3O_{10}$ | 1681 | 1389 | −77 | ○ | $1.6 \times 10^{-5}$ |
| Example 10 | La | 0.487 | 0.256 | 0.256 | $REMO_3, RE_4M_3O_{10}$ | 1808 | 1317 | −128 | ○ | $1.6 \times 10^{-5}$ |
| Example 11 | La | 0.512 | 0.244 | 0.244 | $REMO_3, RE_4M_3O_{10}$ | 505 | 1236 | 361 | ○ | $1.6 \times 10^{-5}$ |
| Example 12 | La | 0.524 | 0.238 | 0.238 | $REMO_3, RE_4M_3O_{10}$ | 373 | 943 | 374 | ○ | $1.5 \times 10^{-5}$ |
| Example 13 | La | 0.459 | 0.270 | 0.270 | $REMO_3, RE_4M_3O_{10}$ | 534 | 1074 | 282 | Δ | $1.6 \times 10^{-5}$ |
| Example 14 | La | 0.535 | 0.233 | 0.233 | $REMO_3, RE_4M_3O_{10}$, NiO | 256 | 702 | 407 | Δ | $1.6 \times 10^{-5}$ |
| Example 15 | Pr | 0.500 | 0.250 | 0.250 | $REMO_3, RE_4M_3O_{10}$ | 147 | 814 | 1619 | ○ | $1.4 \times 10^{-5}$ |
| Example 16 | Nd | 0.500 | 0.250 | 0.250 | $REMO_3, RE_4M_3O_{10}$, NiO | 3.2 | 798 | 2226 | ○ | $1.5 \times 10^{-5}$ |
| Comparative Example 1 | La | 0.500 | 0.500 | 0.000 | $REMO_3$ | 0.33 | 1031 | 3245 | Δ | $2.2 \times 10^{-5}$ |
| Comparative Example 2 | La | 0.500 | 0.150 | 0.350 | $REMO_3, RE_4M_3O_{10}$, NiO | 83 | 809 | 919 | x | $1.7 \times 10^{-5}$ |
| Comparative Example 3 | La | 0.500 | 0.100 | 0.400 | $RE_4M_3O_{10}$, NiO | 75 | 757 | 934 | x | $1.8 \times 10^{-5}$ |
| Comparative Example 4 | La | 0.500 | 0.000 | 0.500 | $RE_2MO_4$, NiO | 41 | 531 | 1032 | x | $1.9 \times 10^{-5}$ |
| Comparative Example 5 | La | 0.444 | 0.278 | 0.278 | $REMO_3, RE_4M_3O_{10}$, NiO | 127 | 901 | 790 | x | $1.6 \times 10^{-5}$ |
| Comparative Example 6 | La | 0.545 | 0.227 | 0.227 | $REMO_3, RE_4M_3O_{10}$, NiO, $Co_3O_4$ | 101 | 326 | 473 | x | $1.7 \times 10^{-5}$ |
| Comparative Example 7 | La | 0.500 | 0.495 | 0.005 | $REMO_3$ | 21 | 1091 | 2522 | Δ | $2.1 \times 10^{-5}$ |

*RE = rare earth metal, M = Co or Ni

As clearly shown in Table 1 and FIG. 1, in the Examples which were represented by the composition formula: REaCobNicOx and in which a, b, and c satisfied the relationships $0.459 \leq a \leq 0.535$, $0.200 \leq b \leq 0.475$, and $0.025 \leq c \leq 0.300$, the perovskite phase was included, the electric conductivity at 25° C. was 3.0 S/cm or more, and the B-value (temperature coefficient of electric conductivity) at 25° C. to 870° C. was 2500 K or less, thereby having properties suitable as an electrically conductive material.

Referring to the Examples 1 to 14 that used the same RE (La), in the Examples 4 to 14 in which b and c satisfied the relationships $0.200 \leq b \leq 0.375$ and $0.125 \leq c \leq 0.300$, the electric conductivity at 25° C. was 250 S/cm or more and the B-value was 600 K or less, which were higher than the electric conductivities and the B-values of Examples 1 to 3 that did not satisfy these relationships. It was also found that, in the Examples 4 to 16 in which the molar ratios of b and c fell within the above-described ranges, the sintered oxide compact contained $RE_4Co_3O_{10}$ or $RE_4Ni_3O_{10}$ in addition to the perovskite phase.

In the Examples 7, 15, and 16 that had the same molar ratio of the constituting elements (the ratio of a, b, and c) but used different types of RE, the electric conductivity was the highest and the B-value was the smallest in the Example 7 in which RE was La. The result suggests that La is preferable as RE.

Meanwhile, in the Comparative Examples 1 and 7 in which c was less than 0.025 (that is, the proportion of Ni is too small), the electric conductivity at 25° C. was less than 3.0 S/cm, and the B-value exceeded 2500 K, showing that these sintered oxide compacts were not easily usable as the electrically conductive material. Note that the Comparative Example 7 is the reproduction of the composition of Patent Literature 2.

In the Comparative Examples 2 to 4 in which c was larger than 0.300 (that is, the proportion of Ni is too large), the water absorption by the sintered oxide compacts was relatively large, and the sinterability was poor.

Relatively large water absorption, and poor sinterability were also observed in the Comparative Example 5 in which a was less than 0.459 (that is, the proportion of RE is too small), and in the Comparative Example 6 in which a was larger than 0.535 (that is, the proportion of RE is too large).

FIG. 1 shows the relationship between the electric conductivity and the temperature for the Examples 1 to 3, Examples 5 to 7, and Comparative Example 1. As clearly shown in FIG. 1, the Examples 1 to 7 had higher electric conductivities than the Comparative Example 1 even at low temperatures, and the temperature-dependent electric conductivity change (B-value) was smaller. The Examples 5 to 7, in which b and c satisfied the relationships $0.200 \leq b \leq 0.375$ and $0.125 \leq c \leq 0.300$, had even higher electric conductivity than the Examples 1 to 3 even at low temperatures, and even smaller B-values.

Figure 2:
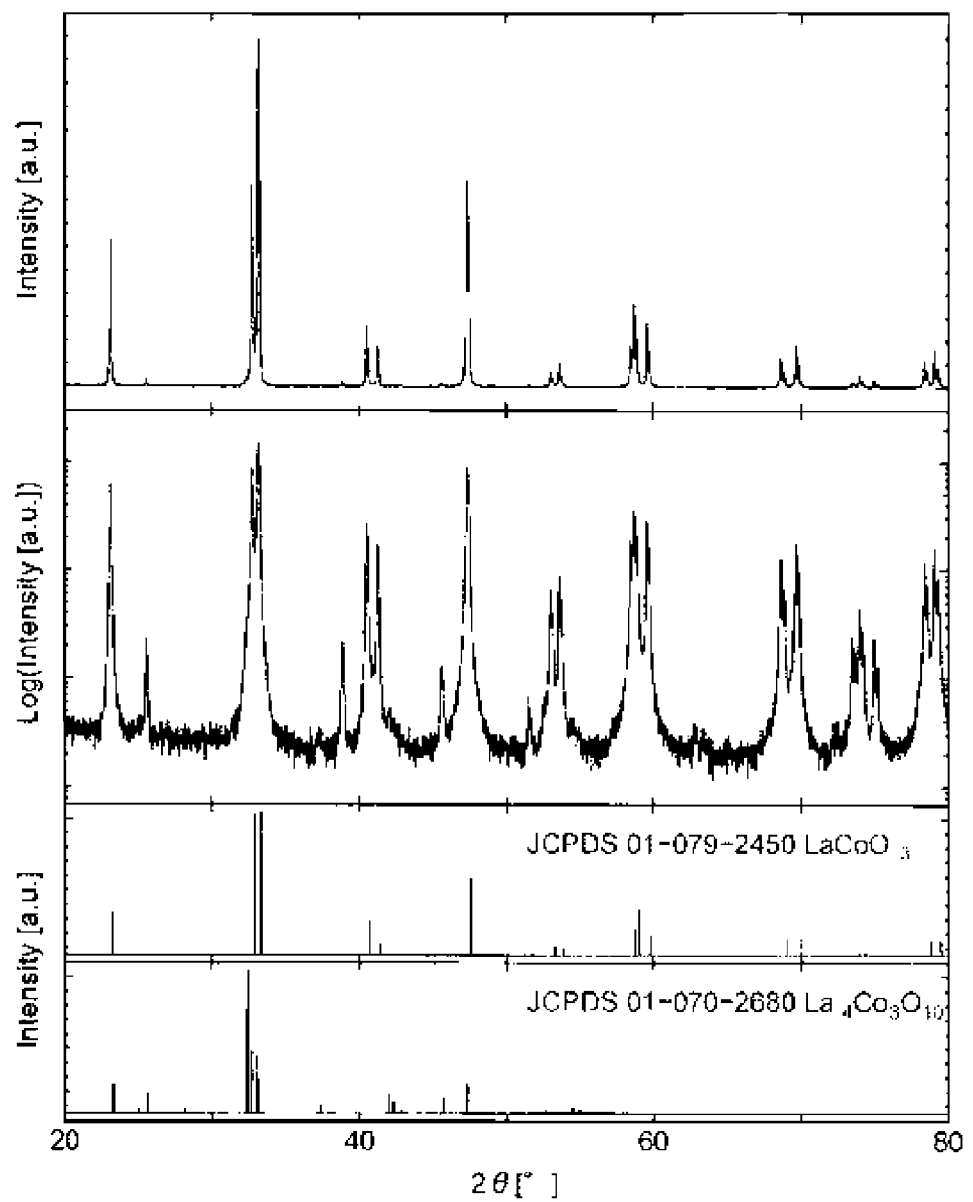
FIG. 2 is a diagram showing an XRD chart of Example 7.
Figure 3:
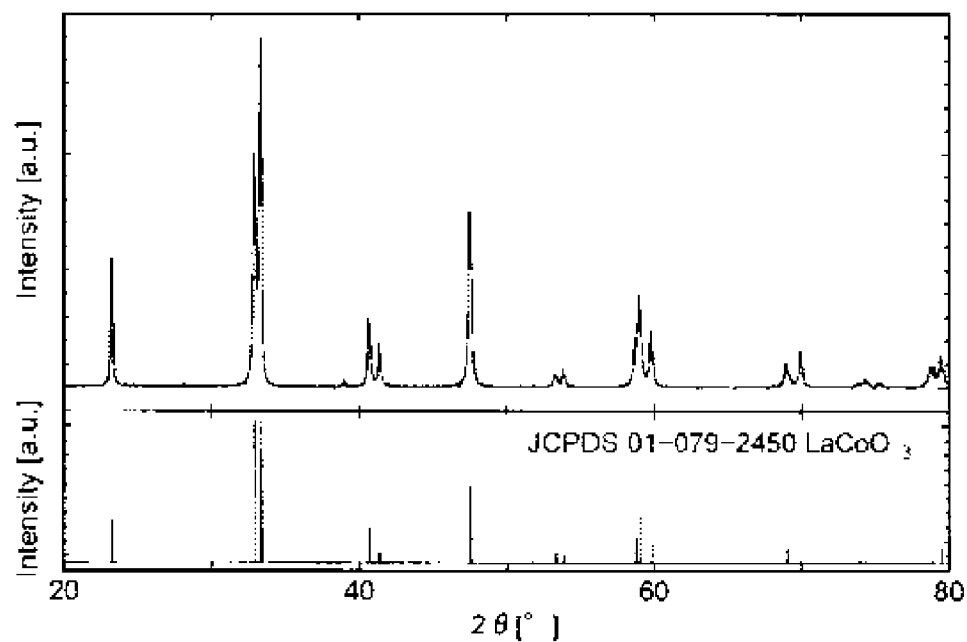
FIG. 3 is a diagram showing the XRD chart of Comparative Example 1.
Figure 4:
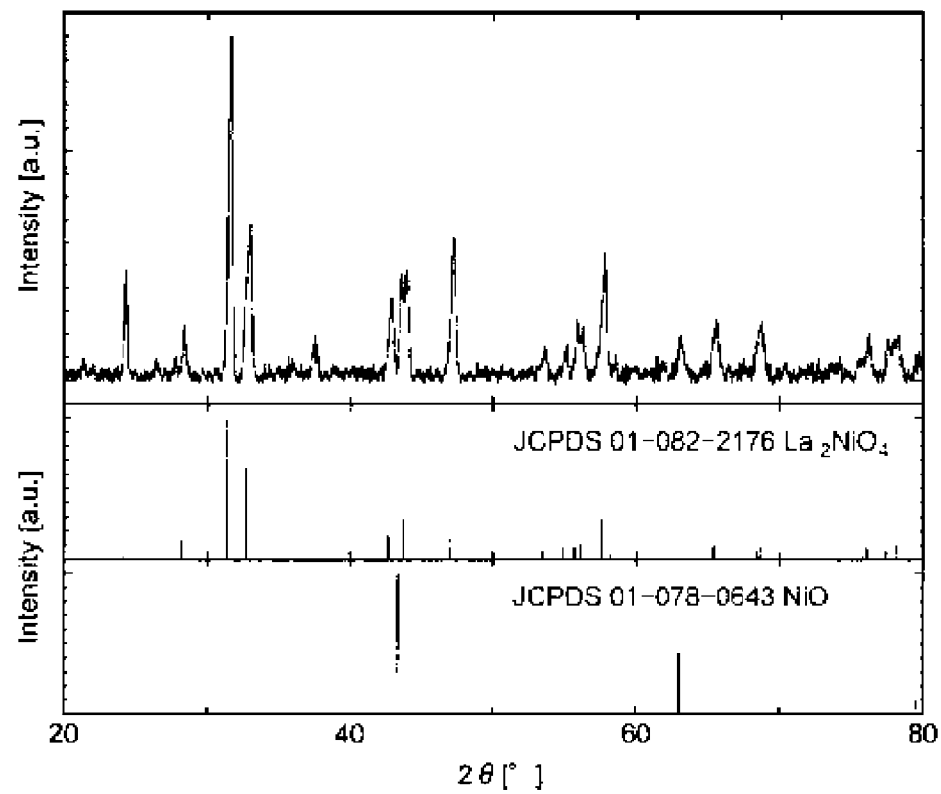
FIG. 4 is a diagram showing the XRD chart of Comparative Example 4.

Further, FIGS. 2 to 4 show the XRD charts of the Example 7, Comparative Example 1, and Comparative Example 4, respectively. It can be seen that a peak of the ternary oxide of $RE \cdot MO_3$ (M is Co or Ni) is detected in the Example 7 and the Comparative Example 1 (FIGS. 2 and 3), and that these sintered oxide compacts include the perovskite phase. On the other hand, the peak of the ternary oxide of $RE \cdot MO_3$ was not detected in the Comparative Example 4 (FIG. 4). Further, in Example 7, a peak attributed to $RE(La)_4Co_3O_{10}$ was also observed in addition to the peak of the ternary oxide of $RE \cdot MO_3$.

What is claimed is:
1. A sintered oxide compact:
wherein the sintered oxide compact is represented by a composition formula: REaCobNicOx (where RE represents a rare earth element, a+b+c=1, and $1.3 \leq x \leq 1.7$);
wherein the sintered oxide compact comprises a perovskite phase with a perovskite-type oxide crystal structure;

wherein the a, b, and c satisfy the following relationships:

$0.474 \leq a \leq 0.524$, $0.200 \leq b \leq 0.475$, and $0.025 \leq c \leq 0.300$; and wherein the sintered oxide compact further comprises $RE_4Co_3O_{10}$ or $RE_4Ni_3O_{10}$ in addition to the perovskite phase.

2. The sintered oxide compact according to claim 1, wherein the RE is La.

3. The sintered oxide compact according to claim 1, wherein the RE is La, and
wherein the b and c satisfy the following relationships:

$0.200 \leq b \leq 0.375$, and $0.125 \leq c \leq 0.300$.

4. The sintered oxide compact according to claim 1, wherein the sintered oxide compact contains substantially no alkali earth metal element.

5. A circuit board in which the sintered oxide compact claim 1 is formed as an electrically conductive layer on a surface of an insulating substrate.

6. The sintered oxide compact according to claim 1,
wherein the sintered oxide compact is produced by performing firing at 1250 to 1450° C. for 1 to 5 hours under air atmosphere or oxygen atmosphere.

7. An electric conductor which is formed from the sintered oxide compact according to claim 1.

8. A circuit board in which an electrically conductive layer is formed on a surface of an insulating substrate,
wherein the electrically conductive layer is configured by a sintered oxide compact;
wherein the sintered oxide compact is represented by a composition formula: $RE_aCo_bNi_cO_x$ (where RE represents a rare earth element, a+b+c=1, and $1.3 \leq x \leq 1.7$);
wherein the sintered oxide compact comprises a perovskite phase with a perovskite-type oxide crystal structure; and
wherein the a, b, and c satisfy the following relationships:

$0.459 \leq a \leq 0.535$, $0.200 \leq b \leq 0.475$, and $0.025 \leq c \leq 0.300$.

* * * * *